United States Patent
Chiang et al.

(10) Patent No.: US 9,159,573 B2
(45) Date of Patent: Oct. 13, 2015

(54) SYSTEMS AND METHODS FOR MONITORING AND CONTROLLING PARTICLE SIZES IN SLURRIES

(71) Applicant: Taiwan Semiconductor Manufacturing Company Limited, Hsinchu (TW)

(72) Inventors: I-Chen Chiang, Hsinchu (TW); Yung-Long Chen, New Taipei (TW); Chih-Chiang Tseng, Hsinchu County (TW); Chi-Chan Yin, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 41 days.

(21) Appl. No.: 14/132,167

(22) Filed: Dec. 18, 2013

(65) Prior Publication Data

US 2015/0170929 A1    Jun. 18, 2015

(51) Int. Cl.
| | | |
|---|---|---|
| H01L 21/44 | (2006.01) | |
| E03B 1/00 | (2006.01) | |
| F17D 1/00 | (2006.01) | |
| F17D 3/00 | (2006.01) | |
| F17D 1/16 | (2006.01) | |
| F17D 1/18 | (2006.01) | |
| B24B 1/00 | (2006.01) | |
| B24B 7/19 | (2006.01) | |
| B24B 7/30 | (2006.01) | |
| H01L 21/306 | (2006.01) | |
| B01F 11/00 | (2006.01) | |
| B01F 15/00 | (2006.01) | |
| H01L 21/66 | (2006.01) | |
| H01L 21/67 | (2006.01) | |

(52) U.S. Cl.
CPC ...... *H01L 21/30625* (2013.01); *B01F 11/0094* (2013.01); *B01F 15/00129* (2013.01); *B01F 15/00324* (2013.01); *H01L 21/67075* (2013.01); *H01L 21/67092* (2013.01); *H01L 21/67155* (2013.01); *H01L 22/10* (2013.01); *B01F 2215/0045* (2013.01)

(58) Field of Classification Search
USPC ............. 451/28–63, 446, 447; 137/1–12; 438/5–18
See application file for complete search history.

(56) References Cited

U.S. PATENT DOCUMENTS

| | | | |
|---|---|---|---|
| 6,338,671 B1 * | 1/2002 | Kawashima et al. | 451/87 |
| 2002/0022441 A1 | 2/2002 | Sugai | |
| 2007/0295063 A1 * | 12/2007 | Cho et al. | 73/61.71 |
| 2009/0298393 A1 | 12/2009 | Kozasa | |

* cited by examiner

*Primary Examiner* — Karen Kusumakar
(74) *Attorney, Agent, or Firm* — Jones Day

(57) ABSTRACT

Systems and methods are provided for preparing a plurality of slurry particles. The system includes: a tank configured to contain and provide the slurry particles, a sampling module configured to sample at least one slurry particle within the tank and obtain at least one parameter related to a particle size, and a controller coupled to the tank and the sampling module, configured to vibrate the slurry particles within the tank based on the at least one parameter.

19 Claims, 6 Drawing Sheets

SYSTEMS AND METHODS FOR MONITORING AND CONTROLLING PARTICLE SIZES IN SLURRIES

FIELD

The technology described in this disclosure relates generally to material processing and more particularly to slurries for material processing.

BACKGROUND

Semiconductor devices are often fabricated through multiple processes, including a rough polishing and/or a finish polishing for generating a smooth surface on a wafer. The finish polishing is usually performed using a slurry which often contains a mixture of minerals, sludge or other suitable materials dispersed in liquid. For example, the slurry contains colloidal silica which is a compound of amorphous anhydrous silicic acid in a colloidal state. In addition, the slurry may include a chemical solution containing abrasive grains used for chemical mechanical polishing (CMP) or wafer lapping.

DETAILED DESCRIPTION

A slurry often includes abrasive particles with different sizes. If a concentration of large-size abrasive particles in a slurry is too high, deep scratches or micro-scratches may be generated on a wafer surface that is polished using the slurry. Thus, it is important to control particle sizes in a slurry to achieve good polishing results.

Figure 1:
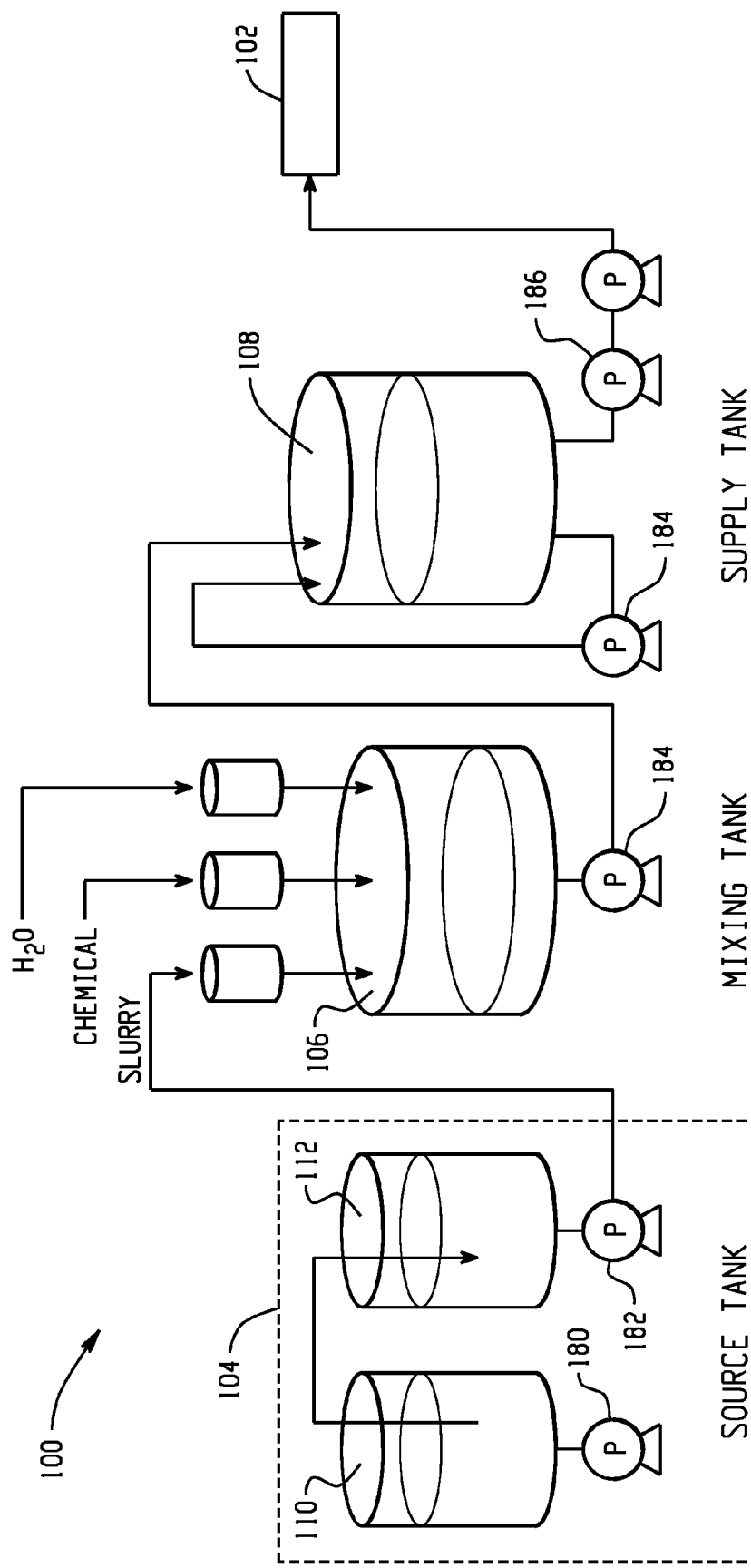
FIG. 1 depicts an example diagram showing a slurry-supplying system.

FIG. 1 depicts an example diagram showing a slurry-supplying system. The system 100 supplies a diluted slurry to a polishing machine 102 for material processing. As shown in FIG. 1, a stock slurry (e.g., an undiluted slurry containing colloidal silica) is provided from a source-tank unit 104 to a mixing tank 106. One or more diluents are added into the mixing tank 106 to dilute the stock slurry. The diluted slurry is then transferred to a supply tank 108 which supplies the diluted slurry to the polishing machine 102 (e.g., a CMP apparatus) for material processing (e.g., finish polishing of a wafer).

Specifically, the source-tank unit 104 includes two source tanks 110 and 112. For example, the stock slurry is transferred from the source tank 110 to the source tank 112, e.g., using a liquid-delivery pump 180. A liquid-delivery pump 182 is used to pressurize the stock slurry out of the source tank 112 toward the mixing tank 106.

Figure 2:
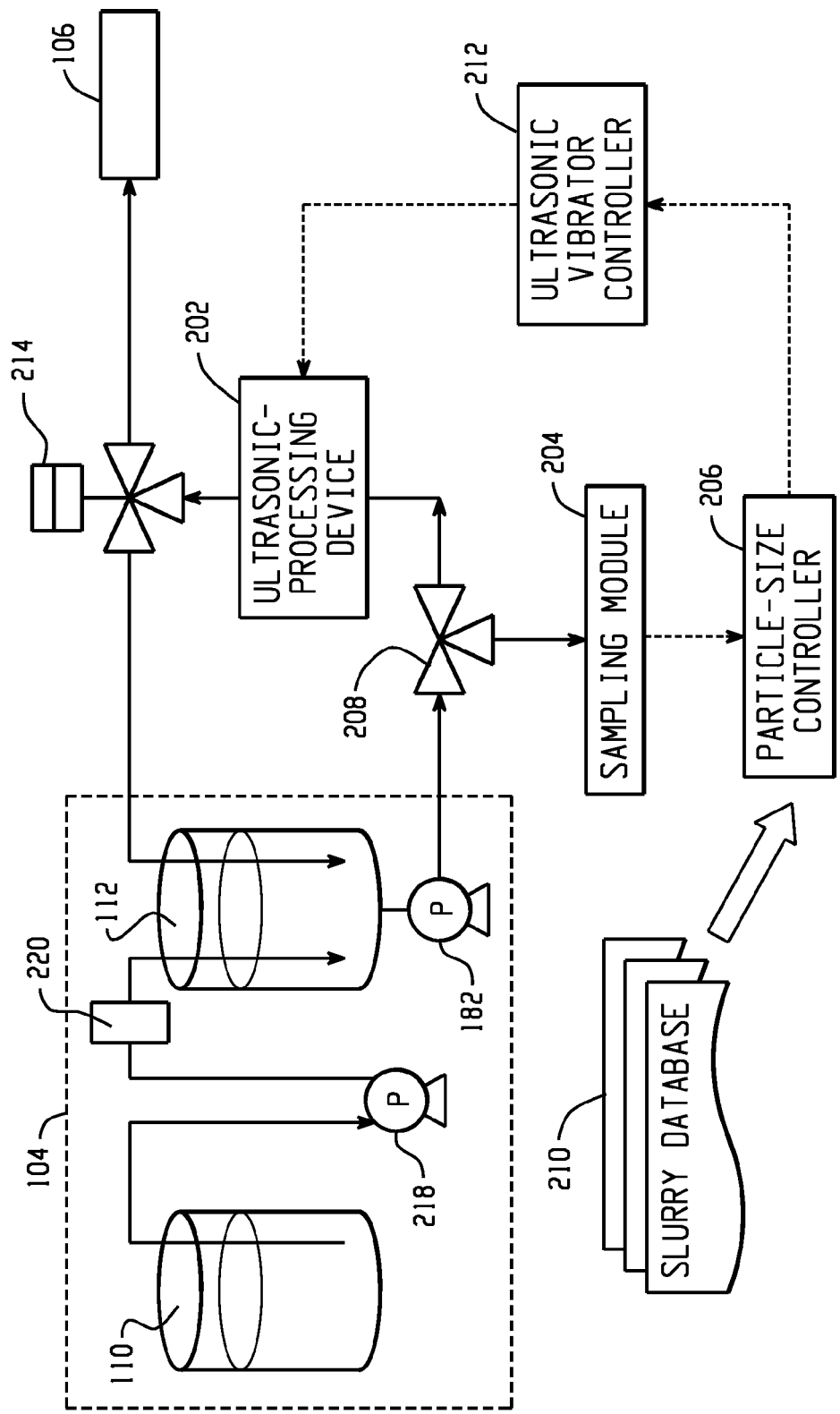
FIG. 2 depicts an example diagram showing a slurry-preparation system used to monitor and control a particle size distribution of a slurry.

As shown in FIG. 2, an ultrasonic processing device 202, a sampling module 204, a particle-size controller 206, and an ultrasonic-vibrator controller 212 are implemented to monitor and control the particle size distribution of the slurry flowing from the source-tank unit 104 toward the mixing tank 106. After passing through the ultrasonic processing device 202, the slurry either circulates back to the source tank 112 or flows to the mixing tank 106 (e.g., through a three-way valve 214) depending on the particle size distribution of the slurry. Specifically, the sampling module 204 samples (e.g., in real time) the slurry through a valve 208 (e.g., a T valve), and obtains one or more parameters related to the particle size distribution of the slurry. For example, backscattering measurements are performed to obtain data related to particle sizes in the slurry, a temperature of the slurry, and/or other suitable parameters of the slurry.

The particle-size controller 206 queries a slurry database 210 to determine whether the obtained parameters related to the particle size distribution of the slurry satisfy certain conditions. For example, the slurry database 210 contains data related to acceptable concentrations of large-size particles and/or acceptable temperature limits for different types of slurries. In some embodiments, the particle-size controller 206 provides data related to a type of the slurry (e.g., $CeO_2$-based slurry, $Al_2O_3$-based slurry, $SiO_2$-based slurry) and a flow rate of the slurry to query the slurry database 210 which outputs data (e.g., a concentration threshold of large-size particles, a temperature limit, etc.) corresponding to the slurry.

If the concentration of large-size particles in the slurry exceeds a concentration threshold provided by the slurry database 210 and the temperature of the slurry is below the temperature limit provided by the slurry database 210, the particle-size controller 206 causes an ultrasonic-vibrator controller 212 to adjust (e.g., turn on) the ultrasonic processing device 202 to apply ultrasonic vibration on the slurry so as to reduce the number of large-size particles in the slurry, and the slurry circulates back to the source tank 112. For example, the ultrasonic-vibrator controller 212 changes the power and the vibration frequency of the ultrasonic processing device 202. On the other hand, if the concentration of large-size particles in the slurry is smaller than or equal to the threshold, the ultrasonic-vibrator controller 212 either keeps the ultrasonic processing device 202 in a current status or stops the ultrasonic processing device 202. The slurry is provided to the mixing tank 106.

In some embodiments, another liquid-delivery pump 218 is placed between the source tank 110 and the source tank 112, and a filter 220 (e.g., next to the pump 218) is also placed between the source tank 110 and the source tank 112 to remove particles equal to or larger than a predetermined size from the stock slurry. In certain embodiments, one or more mass flow controllers (not shown) are used to control a flow rate of the stock slurry that flows from the source tank 110 to the source tank 112.

Figure 3:
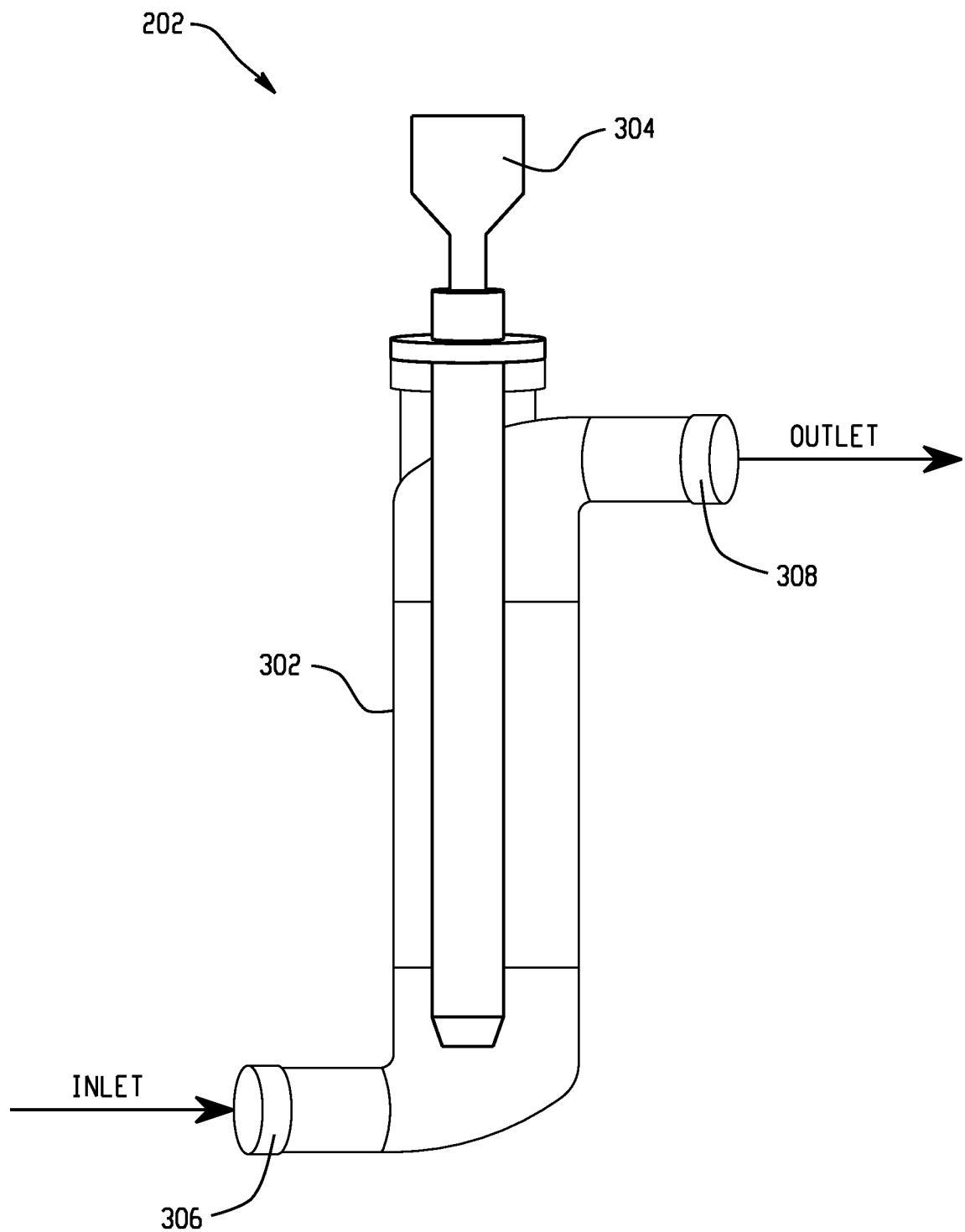
FIG. 3 depicts an example diagram of an ultrasonic processing device.

FIG. 3 depicts an example diagram of the ultrasonic processing device 202. As shown in FIG. 3, the ultrasonic processing device 202 includes a pipe 302 and an ultrasonic vibrator 304. The slurry enters into the pipe 302 through an inlet 306 and flows out of the pipe 302 through an outlet 308. The ultrasonic vibrator 304 vibrates at a particular frequency to break large-size particles into smaller pieces.

Referring back to FIG. 1, the slurry is diluted at a predetermined proportion with one or more diluents (e.g., one or more chemical materials and/or pure water) in the mixing tank 106. For example, concentrated ammonia water and pure water are introduced into the mixing tank 106 to mix with the slurry. In some embodiments, a stirrer (not shown) is used to stir and mix the slurry with the diluents. The diluted slurry is then transferred to the supply tank 108 using a liquid-delivery pump 184. In certain embodiments, another ultrasonic processing device (not shown) is disposed in the supply tank 108 to process the diluted slurry. Another filter (not shown) is used to filter the diluted slurry flowing out of the supply tank 108 to remove particles equal to or larger than a predetermined size before the diluted slurry is provided to the polishing machine 102.

Figure 4:
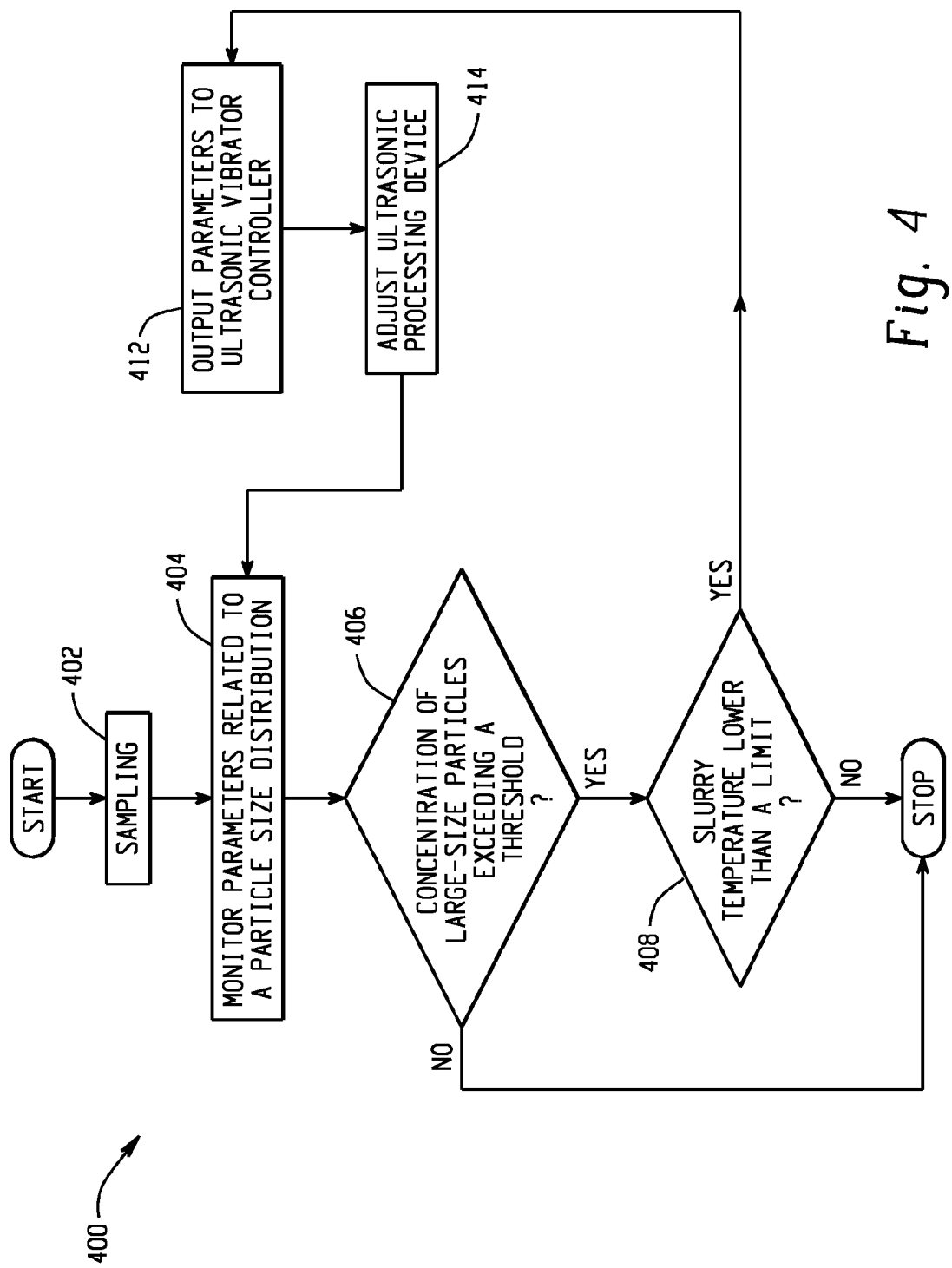
FIG. 4 depicts an example flow chart for monitoring and controlling a particle size distribution of a slurry.

FIG. 4 depicts an example flow chart for monitoring and controlling a particle size distribution of a slurry. As shown in FIG. 4, at 402, a slurry is sampled (e.g., in real time). At 404, one or more parameters related to a particle size distribution of the slurry are monitored. For example, backscattering measurements are performed to obtain (e.g., in real time) data related to particle sizes in the slurry, a temperature of the slurry, and/or other suitable parameters of the slurry. Whether the obtained parameters related to the particle size distribution of the slurry satisfy certain conditions is determined. For example, at 406, whether a concentration of large-size particles in the slurry exceeds a threshold is determined. If the concentration of large-size particles in the slurry does not exceed the threshold, it indicates the particle size distribution of the slurry is acceptable. Thus, the slurry is transferred for subsequent preparation operations (e.g., mixing with one or more diluents). On the other hand, if the concentration of large-size particles in the slurry exceeds the threshold, a determination on whether the slurry temperature is lower than a temperature limit is carried out, at 408.

If the slurry temperature is lower than the temperature limit, an ultrasonic-vibrator controller (e.g., the controller 212) receives certain parameters (e.g., from the controller 206), at 412. At 414, an ultrasonic processing device (e.g., the device 202) associated with the ultrasonic-vibrator controller is adjusted (e.g., being turned on) to apply ultrasonic vibration to the slurry to reduce the number of large-size particles in the slurry. The slurry circulates back to be sampled and monitored. On the other hand, if the slurry temperature is not lower than the temperature limit, the slurry is too hot for material processing. For example, the ultrasonic processing device is adjusted (e.g., being stopped) to reduce the temperature of the slurry.

Figure 5:
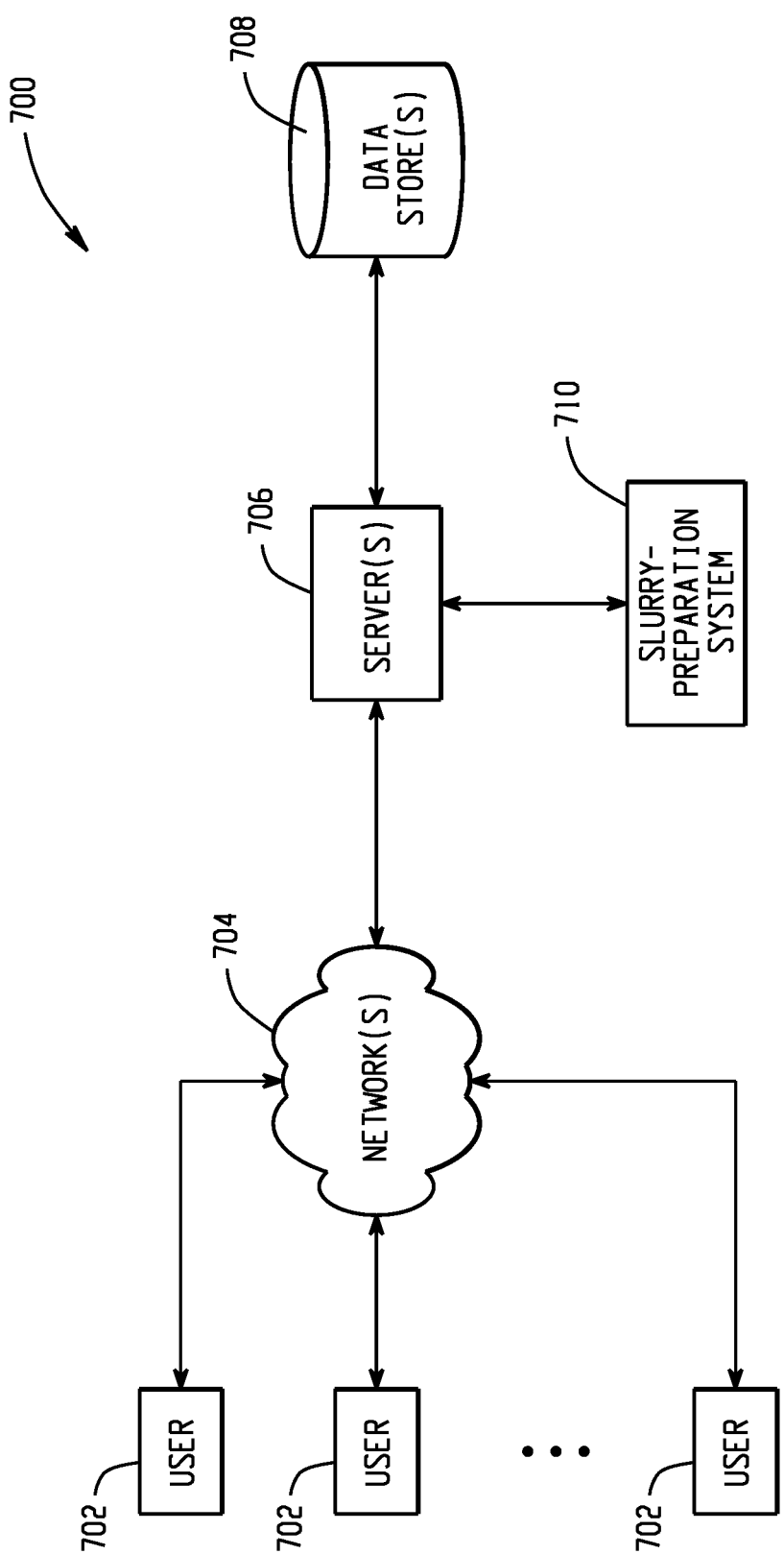
FIG. 5 depicts an example of a computer-implemented environment wherein users can interact with a slurry-preparation system hosted on one or more servers through a network.

FIG. 5 illustrates an example of a computer-implemented environment wherein users 702 can interact with a slurry-preparation system 710 hosted on one or more servers 706 through a network 704. The slurry-preparation system 710 can assist the users 702 to monitor and control a particle size distribution of a slurry. Specifically, the slurry-preparation system 710 is implemented to sample (e.g., in real time) the slurry and obtains one or more parameters related to the particle size distribution of the slurry. For example, the slurry-preparation system 710 is configured to cause backscattering measurements to be performed to obtain data related to particle sizes in the slurry, a temperature of the slurry, and/or other suitable parameters of the slurry.

As shown in FIG. 5, the users 702 can interact with the slurry-preparation system 710 through a number of ways, such as over one or more networks 704. One or more servers 706 accessible through the network(s) 704 can host the slurry-preparation system 710. The one or more servers 706 can also contain or have access to one or more data stores 708 for storing data for the slurry-preparation system 710. In some embodiments, the data stores 708 includes a slurry database, and the slurry-preparation system 710 queries the slurry database to determine whether the obtained parameters related to the particle size distribution of the slurry satisfy certain conditions. For example, the slurry database contains data related to an acceptable concentration of large-size particles and/or a temperature limit. If the concentration of large-size particles in the slurry exceeds a concentration threshold and the temperature of the slurry is below the temperature limit, the slurry-preparation system 710 is configured to adjust (e.g., turn on) an ultrasonic processing device to apply ultrasonic vibration on the slurry so as to reduce the number of large-size particles in the slurry. On the other hand, if the concentration of large-size particles in the slurry is smaller than or equal to the threshold, the slurry-preparation system 710 is configured to either keep the ultrasonic processing device in a current status or stop the ultrasonic processing device. Then, the slurry-preparation system 710 is configured to provide the slurry to subsequent processing (e.g., mixing with diluents) so that the slurry can be used for material processing (e.g., finish polishing of a wafer).

Figure 6:
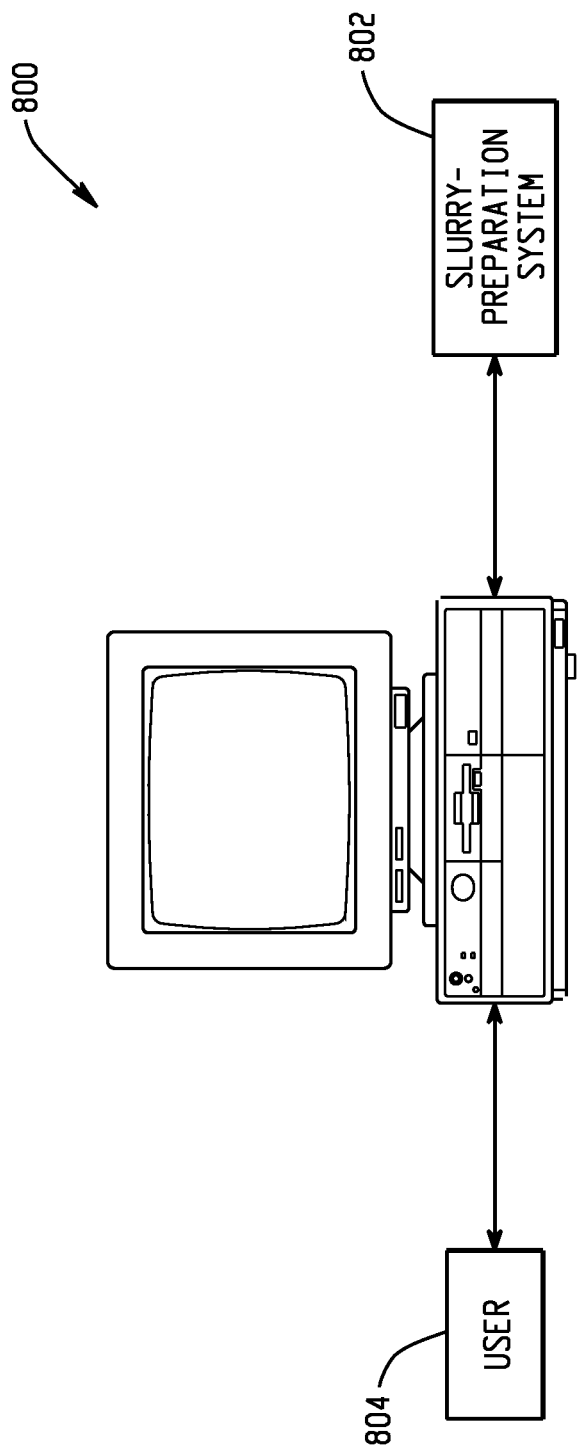
FIG. 6 depicts an example of a slurry-preparation system provided on a stand-alone computer for access by a user.

As another example, a computer-implemented system and method can be configured such that a slurry-preparation system 802 can be provided on a stand-alone computer for access by a user, such as shown at 800 in FIG. 6.

In some embodiments, a system for preparing a plurality of slurry particles includes: a tank configured to contain and provide the slurry particles, a sampling module configured to sample at least one slurry particle within the tank and obtain at least one parameter related to a particle size, and a controller coupled to the tank and the sampling module, configured to vibrate the slurry particles within the tank based on the at least one parameter.

In certain embodiments, a method is provided for preparing a plurality of slurry particles. At least one slurry particle is sampled. At least one parameter related to a particle size of the at least one sampled slurry particle is obtained. The slurry particles are vibrated in response to the at least one parameter. A semiconductor material is polished by a chemical mechanic polishing (CMP) module using the slurry particles.

In some embodiments, a non-transitory computer readable storage medium includes programming instructions for preparing a plurality of slurry particles. The programming instructions are configured to cause one or more data processors to execute certain operations. At least one slurry particle is sampled. At least one parameter related to a particle size of the at least one sampled slurry particle is obtained. The slurry particles are vibrated in response to the at least one parameter. A semiconductor material is polished by a chemical mechanic polishing (CMP) module using the slurry particles.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope or of what may be claimed, but rather as descriptions of features specific to particular embodiments. Certain features that are described in this specification in the context or separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments have been described. Other embodiments are within the scope of the following claims. For example, the actions recited in the claims can be performed in a different order and still achieve desirable results.

What is claimed is:

1. A system for preparing a plurality of slurry particles, the system comprising:
    a source tank configured to store and provide a stock slurry containing the slurry particles;
    a mixing tank coupled downstream of the source tank;
    a sampling module coupled between the source tank and the mixing tank configured to sample the slurry particles and obtain at least one particle size parameter associated with the slurry particles;
    an ultrasonic vibrator arranged in a circulation path to the source tank; and
    a controller coupled to the ultrasonic vibrator and the sampling module, controlling the ultrasonic vibrator to vibrate the slurry particles based on the at least one particle size parameter.

2. The system of claim 1, wherein the sampling module is configured to perform backscattering measurements on the slurry particles.

3. The system of claim 1, wherein the at least one particle size parameter is related to a particle size distribution of the slurry particles.

4. The system of claim 1, further comprising: a database coupled to the controller and configured to store information related to a desired particle size of the slurry particles.

5. The system of claim 4, the database includes a computer-readable non-transitory storage medium.

6. The system of claim 4, wherein the information related to the desired particle size of the slurry particles includes at least one of the following: a type of the slurry particles, a flow rate related to the slurry particles, and a temperature range of the slurry particles.

7. The system of claim 1, wherein the at least one particle size parameter includes at least one of a concentration of the sampled slurry particles with a size larger than a predetermined threshold and a temperature of the sampled slurry particles.

8. The system of claim 1, further comprising: a chemical mechanic polishing (CMP) module configured to polish a semiconductor material using the slurry particles.

9. The system of claim 1, wherein the controller is further configured to dilute the slurry particles based on the at least one particle size parameter.

10. The system of claim 1, wherein the sampling module is configured to sample the slurry particles in real time with the controller configured to vibrate the slurry particles.

11. The system of claim 1, wherein the controller is further configured to adjust the vibration of the slurry particles based on the at least one particle size parameter.

12. A method for preparing a plurality of slurry particles, the method comprising:
    sampling a slurry containing slurry particles;
    obtaining at least one parameter including a temperature parameter and a particle size parameter associated with the sampled slurry;
    selectively vibrating the slurry to reduce particle size and circulating the slurry to reduce temperature thereof in response to the particle size parameter and the temperature parameter, respectively; and
    polishing a semiconductor material by a chemical mechanic polishing (CMP) module using the slurry particles.

13. The method of claim 12, wherein the particle size parameter is related to a particle size distribution of the slurry particles.

14. The method of claim 12, further comprising: vibrating the slurry particles based on an information related to a desired particle size of the slurry particles.

15. The method of claim 14, wherein the information related to the desired particle size of the slurry particles includes at least one of the following: a type of the slurry particles, a flow rate related to the slurry particles, and a temperature range of the slurry particles.

16. The method of claim 12, wherein the particle size parameter includes at least one of a concentration of the sampled slurry particles with a size larger than a predetermined threshold and a temperature of the sampled slurry particles.

17. The method of claim 12, wherein vibrating the slurry utilizes ultrasonic vibration.

18. The method of claim 12, further comprises: adjusting the vibration of the slurry particles based on the particle size parameter.

19. A non-transitory computer readable storage medium comprising programming instructions for preparing a plurality of slurry particles, the programming instructions configured to cause one or more data processors to execute operations comprising:
   sampling a slurry containing slurry particles;
   obtaining a temperature parameter and a particle size parameter associated with the sampled slurry;
   selectively vibrating the slurry to reduce particle size and circulating the slurry to reduce temperature thereof in response to the particle size parameter and the temperature parameter, respectively; and
   polish a semiconductor material by a chemical mechanic polishing (CMP) module using the slurry particles.

* * * * *